US009021539B2

(12) United States Patent
Stelle, IV (10) Patent No.: US 9,021,539 B2
(45) Date of Patent: Apr. 28, 2015

(54) LEAKAGE LOCATION METHODS

(75) Inventor: Raleigh Benton Stelle, IV, Indianapolis, IN (US)

(73) Assignee: Trilithic, Inc., Indianapolis, IN (US)

( * ) Notice: Subject to any disclaimer, the term of this patent is extended or adjusted under 35 U.S.C. 154(b) by 657 days.

(21) Appl. No.: 13/310,041

(22) Filed: Dec. 2, 2011

(65) Prior Publication Data

US 2012/0116697 A1 May 10, 2012

Related U.S. Application Data

(63) Continuation-in-part of application No. 11/742,184, filed on Apr. 30, 2007.

(60) Provisional application No. 60/836,036, filed on Aug. 7, 2006.

(51) Int. Cl.
| | | |
|---|---|---|
| *H04N 7/173* | (2011.01) | |
| *H04N 7/16* | (2011.01) | |
| *G06F 19/00* | (2011.01) | |
| *G01R 31/00* | (2006.01) | |
| *H04N 17/00* | (2006.01) | |
| *H04B 3/32* | (2006.01) | |
| *H04L 29/00* | (2006.01) | |
| *G01R 31/08* | (2006.01) | |

(52) U.S. Cl.
CPC .............. *H04N 17/00* (2013.01); *G01R 31/001* (2013.01); *G01R 31/083* (2013.01); *H04B 3/32* (2013.01); *H04L 29/00* (2013.01)

(58) Field of Classification Search
None
See application file for complete search history.

(56) References Cited

U.S. PATENT DOCUMENTS

| | | |
|---|---|---|
| 3,526,831 A | 9/1970 | Smith |
| 3,826,306 A | 7/1974 | Marsh |
| 4,060,718 A | 11/1977 | Huddle |
| 4,072,899 A | 2/1978 | Shimp |
| 4,390,836 A | 6/1983 | Bruce et al. |
| 4,413,229 A | 11/1983 | Grant |
| 4,612,797 A | 9/1986 | Barkhoudarian |
| 4,733,356 A | 3/1988 | Haeussermann et al. |
| 4,775,839 A | 10/1988 | Kosina et al. |
| 4,810,961 A | 3/1989 | Takahashi et al. |
| 4,814,711 A | 3/1989 | Olsen et al. |

(Continued)

OTHER PUBLICATIONS

Sunrise Telecom News Release, "Sunrise Telecom to Acquire the CaLan Cable TV Test Business from Agilent Technologies", Jan. 24, 2002, 1 page.

(Continued)

*Primary Examiner* — Oschta Montoya
(74) *Attorney, Agent, or Firm* — Barnes & Thornburg LLP (57) ABSTRACT

"Cradle-to-grave" treatment of leaks begins with technicians logging leakage signal strengths and GPS latitude and longitude coordinates in technicians' vehicles as the technicians go about their daily assignments. Leakage signal strengths and GPS latitude and longitude coordinates are then uploaded to a leakage server. The server calculates leak latitude and longitude coordinates and signal strengths. The system sends the leakage signal strengths and/or calculated leak latitude and longitude coordinates to technicians' vehicles, for example, as components of, or attachments to, work orders. The latitudes and longitudes are converted by GPS navigators in the technicians' vehicles to turn-by-turn directions to the calculated leak locations. The technicians drive to the leaks, identify and repair them, and close the work orders.

9 Claims, 8 Drawing Sheets

(56) References Cited

U.S. PATENT DOCUMENTS

| | | |
|---|---|---|
| 4,857,851 A | 8/1989 | Anderson et al. |
| 4,924,450 A | 5/1990 | Brashear et al. |
| 5,140,307 A | 8/1992 | Rebetez et al. |
| 5,144,317 A | 9/1992 | Duddek et al. |
| 5,155,490 A | 10/1992 | Spradley, Jr. et al. |
| 5,182,566 A | 1/1993 | Ferguson et al. |
| 5,294,937 A | 3/1994 | Ostteen et al. |
| 5,557,282 A | 9/1996 | Mertens |
| 5,589,631 A | 12/1996 | Spring et al. |
| 5,608,428 A | 3/1997 | Bush |
| 5,625,150 A | 4/1997 | Greene et al. |
| 5,777,662 A | 7/1998 | Zimmerman |
| 6,005,518 A | 12/1999 | Kallina |
| 6,009,334 A | 12/1999 | Grubeck et al. |
| 6,018,358 A | 1/2000 | Bush |
| 6,272,350 B1 | 8/2001 | Tekinay |
| 6,307,593 B1 | 10/2001 | Bowyer et al. |
| 6,310,646 B1 | 10/2001 | Sbi et al. |
| 6,313,874 B1 | 11/2001 | Bowyer et al. |
| 6,337,711 B1 | 1/2002 | Dickinson et al. |
| 6,437,740 B1 | 8/2002 | De Champlain et al. |
| 6,801,162 B1 | 10/2004 | Eckenroth et al. |
| 6,833,859 B1 | 12/2004 | Schneider et al. |
| 7,116,685 B2 * | 10/2006 | Brown et al. ............ 370/485 |
| 7,548,201 B2 | 6/2009 | Eckenroth et al. |
| 7,945,939 B2 | 5/2011 | Eckenroth et al. |
| 8,688,532 B2 * | 4/2014 | Khunger et al. ........... 705/26.1 |
| 2003/0022645 A1 | 1/2003 | Runzo |
| 2007/0022457 A1 | 1/2007 | Eckenroth et al. |
| 2008/0133308 A1 | 6/2008 | Harris |
| 2008/0167808 A1 | 7/2008 | Harris et al. |
| 2009/0300534 A1 | 12/2009 | Bush et al. |

OTHER PUBLICATIONS

Agilent (HP) 85960B: HP CaLan 2010B SLM plus product description, 2 pages, Accessed Jul. 31, 2009.
CaLan 3010/2010 Signal/Sweep Measurement System product description, Mar. 2003, 4 pages.
GeoSniffer System User Guide, 1995, 4 pages.
DDF6100D Radio Direction Finder User Manual, 1997, 60 pages.
"Wavetracker Technical Manual and Users Guide", Rev. 99-1, 1998, Cable Leakage Technologies, Inc.
Doppler Systems inc., "Locating Cable TV Leaks using Doppler Radio Direction Finding Systems", Mar. 15, 1994, 5 pages.

* cited by examiner

LEAKAGE LOCATION METHODS

CROSS-REFERENCE TO RELATED APPLICATIONS

This application is a continuation-in-part of U.S. Ser. No. 11/742,184 filed Apr. 30, 2007. U.S. Ser. No. 11/742,184 claims the benefit under 35 U.S.C. §119(e) of the Aug. 7, 2006 filing date of U.S. Ser. No. 60/836,036. The complete disclosures of both U.S. Ser. No. 11/742,184 and U.S. Ser. No. 60/836,036 are incorporated herein in their entireties by reference.

BACKGROUND OF THE INVENTION

This invention relates to methods for determining the location of leakage from, for example, CATV cables, taps, fittings, drops and other CATV plant facilities.

DISCLOSURE OF THE INVENTION

According to an aspect of the invention, a method of determining the location of a leakage signal from a network includes measuring at various times and locations leakage believed to be associated with the leakage signal. The method further includes constructing a data base of leakages and associated locations, selecting from the data base a number of leakage values, and multiplying the selected leakage signal values times a first locus of points on which a leakage signal associated with a respective signal strength may be assumed to reside to develop a number of relationships among leakage signal strength, leakage and location. The method further includes solving a first pair of these relationships among leakage signal strength, leakage and location for a second locus of common points to the first pair, solving a second pair of these relationships among leakage signal strength, leakage and location for a third locus of common points to the second pair, projecting the second and third loci onto a common surface, and determining the intersection of the second and third loci on the common surface.

Illustratively according to this aspect, identifying latitude and longitude coordinates where the leakage signal strengths are measured comprises identifying latitude and longitude coordinates using a positioning or geolocation system.

Illustratively according to this aspect, the method further includes determining the strength of the leakage signal by substituting the intersection of the second and third loci on the common surface back into a selected relationship among leakage signal strength, leakage and location and solving for the strength of the leakage signal.

Illustratively according to this aspect, solving a first pair of these relationships among leakage signal strength, leakage and location for a second locus of common points to the first pair and solving a second pair of these relationships among leakage signal strength, leakage and location for a third locus of common points to the second pair together comprise selecting a location about which the solutions are to be normalized and solving the first and second pairs of the relationships about the location about which the solutions are to be normalized.

Illustratively according to this aspect, solving a first pair of these relationships among leakage signal strength, leakage and location for a second locus of common points to the first pair and solving a second pair of these relationships among leakage signal strength, leakage and location for a third locus of common points to the second pair, and projecting the second and third loci onto a common surface together comprise converting an angular distance into a linear distance. Illustratively according to this aspect, converting an angular distance into a linear distance comprises using a table to convert an angular distance into a linear distance.

Illustratively according to this aspect, converting an angular distance into a linear distance comprises calculating a linear distance from an angular distance. Illustratively according to this aspect, measuring at various times and locations leakage believed to be associated with the leakage signal comprises intermittently measuring at various locations leakage believed to be associated with the leakage signal.

Illustratively according to this aspect, measuring at various times and locations leakage believed to be associated with the leakage signal comprises periodically measuring at various locations leakage believed to be associated with the leakage signal.

According to another aspect of the invention, a method for repairing signal leakage from a CATV network comprises traversing an area served by the CATV network, measuring leakage signal strengths, identifying latitude and longitude coordinates where the leakage signal strengths are measured, and storing the measured leakage signal strengths and latitude and longitude coordinates where the leakage signal strengths are measured. The method further includes transferring the measured leakage signal strengths and corresponding latitude and longitude coordinates to a computer, calculating leak latitude and longitude coordinates and signal strengths on the computer from the transferred leakage signal strengths and latitude and longitude coordinates, transferring the calculated leak locations to technicians, dispatching the technicians to repair the leaks, and repairing the leaks.

Illustratively according to this aspect, identifying latitude and longitude coordinates where the leakage signal strengths are measured comprises identifying latitude and longitude coordinates using a positioning or geolocation system.

Illustratively according to this aspect, measuring leakage signal strengths, identifying latitude and longitude coordinates where the leakage signal strengths are measured, storing the measured leakage signal strengths and latitude and longitude coordinates where the leakage signal strengths are measured, and transferring the measured leakage signal strengths and corresponding latitude and longitude coordinates to a computer comprises making leakage measurements, making latitude and longitude measurements, associating each leakage measurement with a respective latitude and longitude measurement, creating a data base of associated leakage measurement and respective latitude and longitude measurement, selecting from the data base a number of leakage measurements, multiplying the selected leakage measurements times a first locus of points on which a leakage signal associated with that respective leakage measurement may be assumed to reside to develop a number of relationships among leakage measurement, latitude and longitude, solving a first pair of these relationships among leakage measurement, latitude and longitude for a second locus of points common to the first pair, solving a second pair of these relationships among leakage measurement, latitude and longitude for a third locus of points common to the second pair, projecting the second and third loci onto a common surface, and determining the intersection of the second and third loci on the common surface.

Illustratively according to this aspect, the method further includes determining the strength of the leakage signal by substituting the intersection of the second and third loci on the common surface back into a selected relationship among relationships among leakage measurement, latitude and longitude and solving for leakage signal strength.

Illustratively according to this aspect, solving a first pair of these relationships among leakage measurement, latitude and longitude for a second locus of points common to the first pair and solving a second pair of these relationships among leakage measurement, latitude and longitude for a third locus of points common to the second pair together comprise selecting a latitude and longitude about which the solutions are to be normalized and solving the first and second pairs of relationships about the latitude and longitude about which the solutions are to be normalized.

Illustratively according to this aspect, solving a first pair of these relationships among leakage signal strength, leakage and location for a second locus of common points to the first pair and solving a second pair of these relationships among leakage signal strength, leakage and location for a third locus of common points to the second pair, and projecting the second and third loci onto a common surface together comprise converting an angular distance into a linear distance.

Illustratively according to this aspect, converting an angular distance into a linear distance comprises using a table to convert an angular distance into a linear distance.

Illustratively according to this aspect, converting an angular distance into a linear distance comprises calculating a linear distance from an angular distance.

Illustratively according to this aspect, measuring leakage and identifying latitude and longitude coordinates where the leakage is measured comprises intermittently measuring leakage and identifying latitude and longitude coordinates where the leakage is measured.

Illustratively according to this aspect, measuring leakage and identifying latitude and longitude coordinates where leakage is measured comprises periodically measuring leakage and identifying latitude and longitude coordinates where the leakage is measured.

BRIEF DESCRIPTION OF THE DRAWINGS

The invention may best be understood by referring to the following detailed description and accompanying drawings which illustrate the invention. In the drawings.

DETAILED DESCRIPTIONS OF ILLUSTRATIVE EMBODIMENTS

Leakage measurements of signal from a CATV plant including, for example, CATV cables, taps, fittings, drops and other CATV plant facilities, may readily be made by, for example, CATV system employees during their conduct of their daily activities. Such leakage measurements, stored in leakage measurement equipment of the type described in, for example, Trilithic Seeker™ GPS leakage management system available from Trilithic, Inc., 9710 Park Davis Drive, Indianapolis, Ind. 46235, the disclosure of which is hereby incorporated herein by reference, are uploaded from such CATV system employee equipment into a server at a CATV headend, for example, at the ends of the employees' shifts. Such CATV system employees' daily activities may include, for example, visiting subscriber sites to conduct maintenance and repairs, driving the CATV system to log leakage levels, and so on.

This activity can provide a database of cable system leakage strengths measured at multiple locations, which can be determined with considerable accuracy by associating with each such measurement a location, such as a latitude and longitude provided by a positioning or geolocation system, such as a Global Positioning System (GPS) device. Such data sets might look like the following Table I when sorted in order of descending detected leakage level and eliminating leakage levels below a certain threshold (10 μV in this example):

TABLE I

| Latitude | Longitude | Leakage (μV or other suitable dimension) |
|---|---|---|
| 39.502145° | −85.594748° | 26 |
| 39.502003° | −85.594720° | 23 |
| 39.502089° | −85.594722° | 21 |
| 39.502066° | −85.594746° | 20 |
| 39.502131° | −85.595057° | 19 |
| 39.502223° | −85.594751° | 16 |
| 39.502210° | −85.595003° | 16 |
| 39.502188° | −85.595096° | 16 |
| 39.502183° | −85.595142° | 16 |
| 39.502208° | −85.594939° | 15 |
| 39.502011° | −85.594726° | 14 |
| 39.502145° | −85.594750° | 14 |
| 39.502303° | −85.594753° | 13 |
| 39.502054° | −85.594725° | 13 |
| 39.502196° | −85.595049° | 13 |
| 39.502172° | −85.595028° | 13 |
| 39.502095° | −85.594724° | 12 |
| 39.502094° | −85.595056° | 12 |
| 39.502182° | −85.595002° | 12 |
| 39.502194° | −85.594972° | 12 |
| 39.502098° | −85.594727° | 11 |
| 39.502175° | −85.594723° | 11 |
| 39.502226° | −85.594959° | 11 |
| 39.502226° | −85.594959° | 11 |
| 39.502181° | −85.595188° | 11 |
| 39.502067° | −85.595321° | 11 |
| 39.502062° | −85.595106° | 11 |
| 39.502063° | −85.594713° | 11 |
| 39.502175° | −85.594727° | 10 |
| 39.502114° | −85.595058° | 10 |
| 39.502146° | −85.595055° | 10 |
| 39.502160° | −85.595045° | 10 |

Using this data, which, again, is typically extracted from a larger data set accumulated over days, weeks, months, etc., of data collection and then sorted and limited by differences of latitude and longitude from the largest system leak in the list, the location and magnitude of a leakage source giving rise to this data may be isolated. The method employs leakage signal strength versus distance considerations.

Leakage detectors and their associated antenna systems are calibrated to be accurate at a fixed distance from a radiation source, such as the source of a leak. It is not uncommon in the CATV industry to use three meters as a measurement standard. So, in the case of a 10 μV/m leak, for example, which is calibrated to be accurate at a distance of three meters from the leakage source, a leak indicated as having a strength of 10

μV/m could reside anywhere on a radius three meters from the leakage antenna. If the leakage strength were doubled to 20 μV/m and the antenna were six meters from the source, the leakage detecting instrument would still indicate a leakage signal strength of 10 μV/m. So, for a given measured 10 μV/m leak, one can envision an inverted cone of potential leakage sources and leakage signal strengths which would all give rise to the same 10 μV/m reading at the location of the leakage detecting antenna, with the x and y dimensions of the cone being the longitude and latitude of the cone's surface at various points and z being the indicated strength of the leakage signal. In this example, there is a three meter circle of potential 10 μV/m leaks around the leakage antenna, a six meter circle of 20 μV/m leaks, a nine meter circle of 30 μV/m leaks, and so on in circles of increasing radius at increasing heights (z values) corresponding to increasing leakage signal strength. If one imagines the location for this 10 μV/m reading on the leakage detector to be defined by latitude and longitude coordinates with x mapping to longitude, y mapping to latitude and z mapping to leakage level, then the increasing circles around the current location of the leakage detector can be visualized as a cone standing on its apex. Every leak stored in the database can be represented in this way with its apex at the GPS-determined position of the antenna at the time the particular leakage signal strength is measured. The equation for each leakage cone may then be written as:

$$z = L_1 \text{sqrt}((x-x_1)^2 + (y-y_1)^2)$$

where sqrt is the square root operator;
$L_1$ = the measured leakage value at a calibrated distance (three meters in the following examples);
$x_1$ = the longitude of the measured leak; and,
$y_1$ = the latitude of the measured leak.

Figure 1:
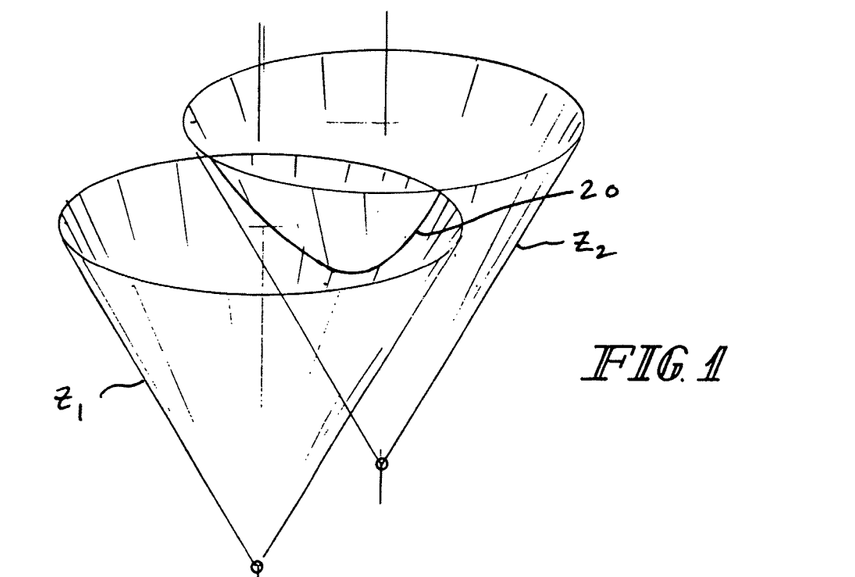
FIG. 1 illustrates a perspective view useful in understanding the present invention.
Figure 2:
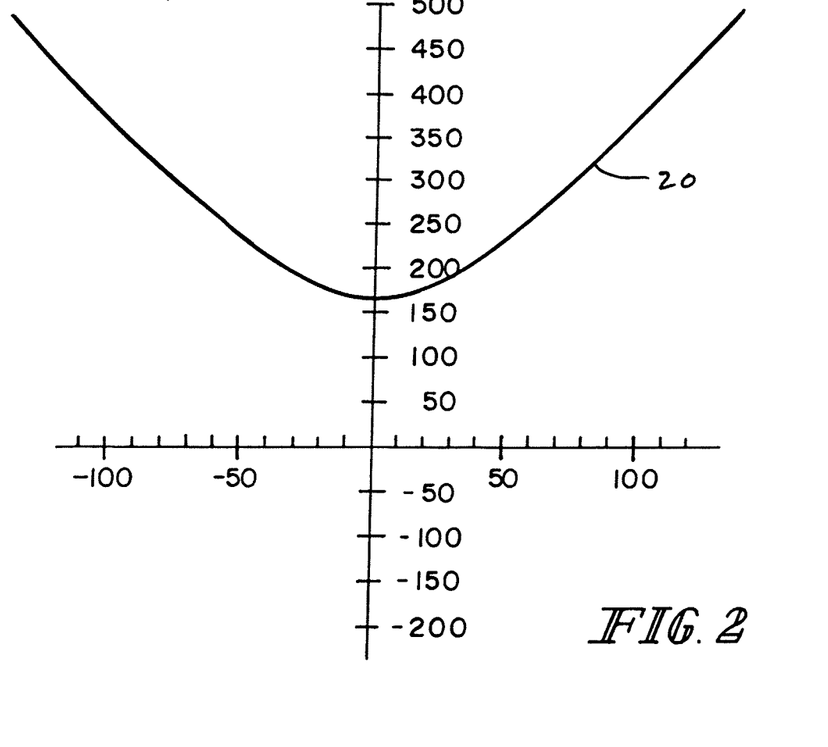
FIG. 2 illustrates a graph useful in understanding the present invention.
Figure 3:
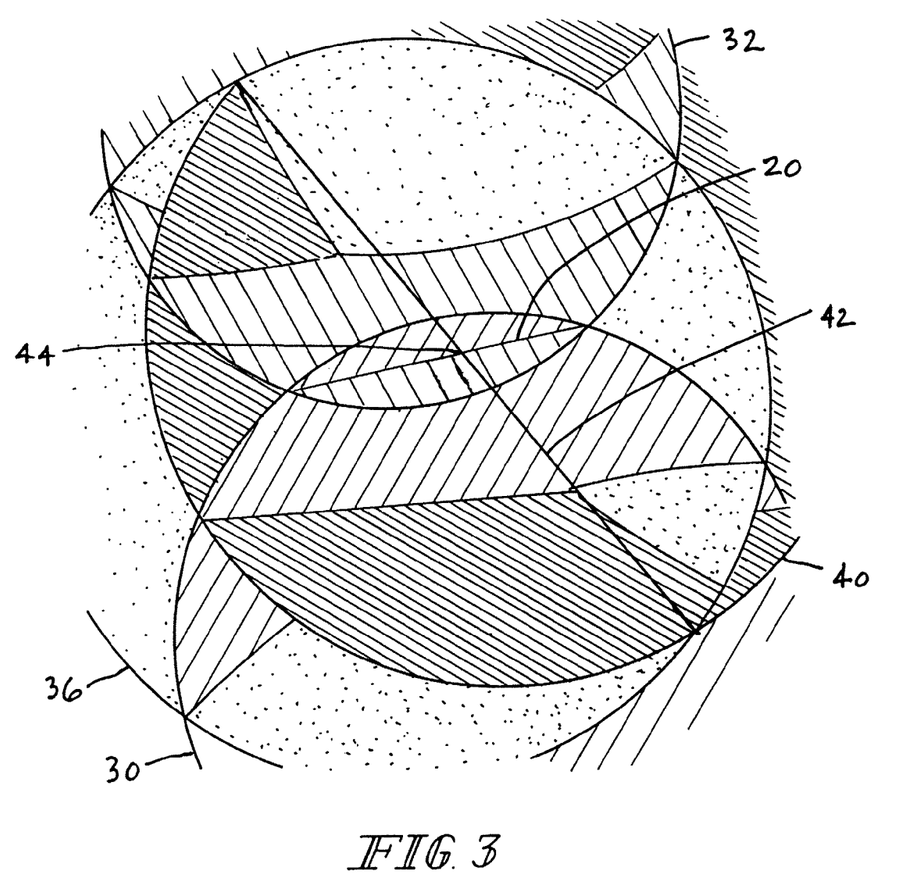
FIG. 3 illustrates a plan view useful in understanding the present invention.

For purposes of this discussion, $z_n$ will indicate the nth detected leak. Using (arbitrarily) the first four rows of the above data set, the following four equations are obtained:

$$z_1 = L_1 \text{sqrt}((x-x_1)^2 + (y-y_1)^2);$$

$$z_2 = L_2 \text{sqrt}((x-x_2)^2 + (y-y_2)^2);$$

$$z_3 = L_3 \text{sqrt}((x-x_3)^2 + (y-y_3)^2); \text{ and,}$$

$$z_4 = L_4 \text{sqrt}((x-x_4)^2 + (y-y_4)^2),$$

where $x_n$, $y_n$ and $z_n$ are the longitude, latitude and leakage signal strength displayed in the nth row of the above table, and $L_1 = 26/3 \, \mu V/m;$ $L_2 = 23/3 \, \mu V/m;$ $L_3 = 21/3 \, \mu V/m;$ and $L_4 = 20/3 \, \mu V/m,$ using the above convention, leakage signal strength detected at three meters from the leakage antenna. From the above Table I:

$x_1 = -85.594748°;$ $x_2 = -85.594720°;$ $x_3 = -85.594722°;$ $x_4 = -85.594746°;$ $y_1 = 39.502145°;$ $y_2 = 39.502003°;$ $y_3 = 39.502089°;$ and, $y_4 = 39.502066°.$ If the intersection of two adjacent inverted cones, for example, $z_1$ and $z_2$, is plotted, the intersection is an arc 20, as illustrated in FIG. 1. An enlarged, two dimensional illustration of this intersection is illustrated in FIG. 2. If the intersection of another two adjacent inverted cones, for example, $z_3$ and $z_4$, is then plotted, another similar intersection is formed. Looking down from above on the two arcs formed by the intersections of pairs of the four data points, a point of intersection is illustrated in FIG. 3.

Again, looking into any of these cones $z_1$, $z_2$, $z_3$, $z_4$ from above, at any given leakage signal strength (that is, any vertical elevation), it may be visualized as a circle. In FIG. 3, circle 30 illustrates the downward view along the z axis of $z_1$. Circle 32 illustrates the downward view along the z axis of $z_2$. Continuing to look down from above, then, the intersection of these two inverted cones is the arc 20. Circle 36 illustrates the downward view along the z axis of $z_3$. Circle 40 illustrates the downward view along the z axis of $z_4$. The intersection of the cones $z_3$ and $z_4$ is the arc 42. Arcs 20, 42 projected downward intersect at a point 44 in latitude and longitude, which is the calculated location of the leak which is the source of this data.

Now that a specific x and y, that is, longitude and latitude, of interest have been identified, those values can be substituted back into any one of the equations above for $z_1$, $z_2$, $z_3$ or $z_4$ to calculate the strength of the leak at that x and y. For purposes of illustration, the equation for $z_1$ will be used to demonstrate this. First, the differences $(y-y_1)$ and $(x-x_1)$ in latitude and longitude need to be converted into meters. Tables stored in instruments such as the above-mentioned server at a CATV headend, a separate computer associated therewith, or calculators provided in such instruments, or some combination of these, are used for these conversions, since such conversions depend upon the latitudes and longitudes which are the subjects of the calculations, that is, upon the curvature of the earth's surface at the latitudes and longitudes of interest. See, for example, http://www.csgnetwork.com/degreelenllavcalc.html, for such a calculator.

$$z_1 = (26/3) \text{sqrt}((x+85.594748°)^2 + (y-39.502145°)^2);$$

$$z_2 = (23/3) \text{sqrt}((x+85.594720°)^2 + (y-39.502003°)^2);$$

$$z_3 = (21/3) \text{sqrt}((x+85.594722°)^2 + (y-39.502089°)^2); \text{ and,}$$

$$z_4 = (20/3) \text{sqrt}((x+85.594746°)^2 + (y-39.502066°)^2).$$

The longitudes and latitudes are normalized to coordinates which lie fairly centrally among them, in this case, −85.594735°, 39.502070°. See FIG. 4. This particular point is at about the intersection of a line drawn between $(x_1, y_1)$ and $(x_2, y_2)$ and a line drawn between $(x_3, y_3)$ and $(x_4, y_4)$. This point can also be determined by solving the simultaneous equations $(y-y_1)/(x-x_1) = (y_2-y_1)/(x_2-x_1)$ and $(y-y_3)/(x-x_3) = (y_4-y_3)/(x_4-x_3)$ for x and y. Normalization is performed to implement the above-discussed conversion to meters, which then yields the leakage field strength in μV/m. The calculations thus become:

$$z_1 = (26/3) \text{sqrt}((0.000013°)^2 + (-0.000075°)^2);$$

$$z_2 = (23/3) \text{sqrt}((-0.000015°)^2 + (0.000067°)^2);$$

$$z_3 = (21/3) \text{sqrt}((-0.000013°)^2 + (-0.000018°)^2); \text{ and,}$$

$$z_4 = (20/3) \text{sqrt}((0.000011°)^2 + (0.000004°)^2),$$

where, at this latitude and longitude, $14 \times 10^{-6\circ} \approx 1.55435$ m and $67 \times 10^{-6\circ} \approx 5.76273$ m at $x=-85.594735°$ and $y=39.502070°$. Picking $z_1$ and converting the latitude and longitude differences to meters as discussed above yields a leakage strength of about 51.7285 μV/m at the location of the leak.

Figure 4:
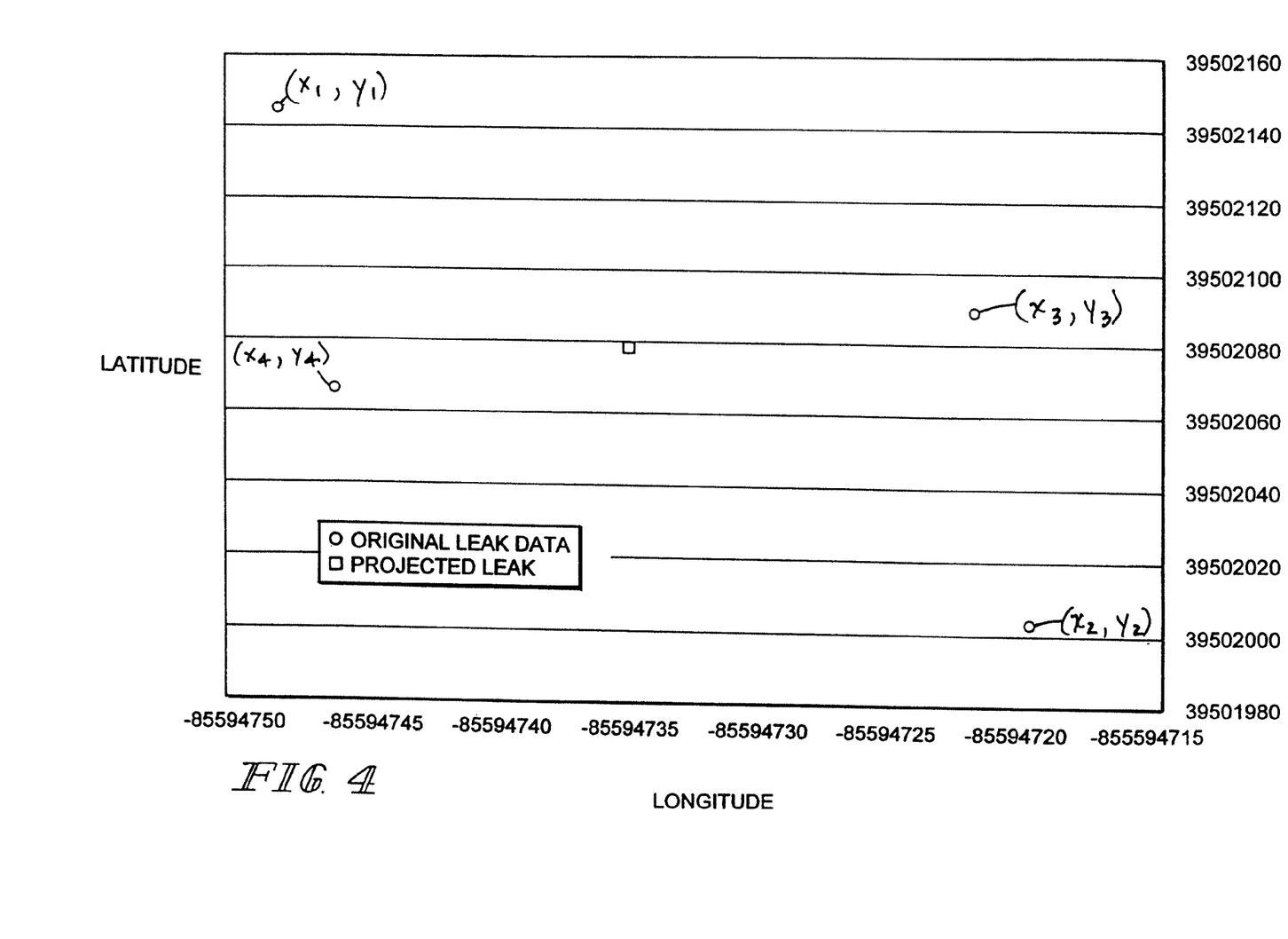
FIG. 4 illustrates a graph useful in understanding the present invention.
Figure 5:
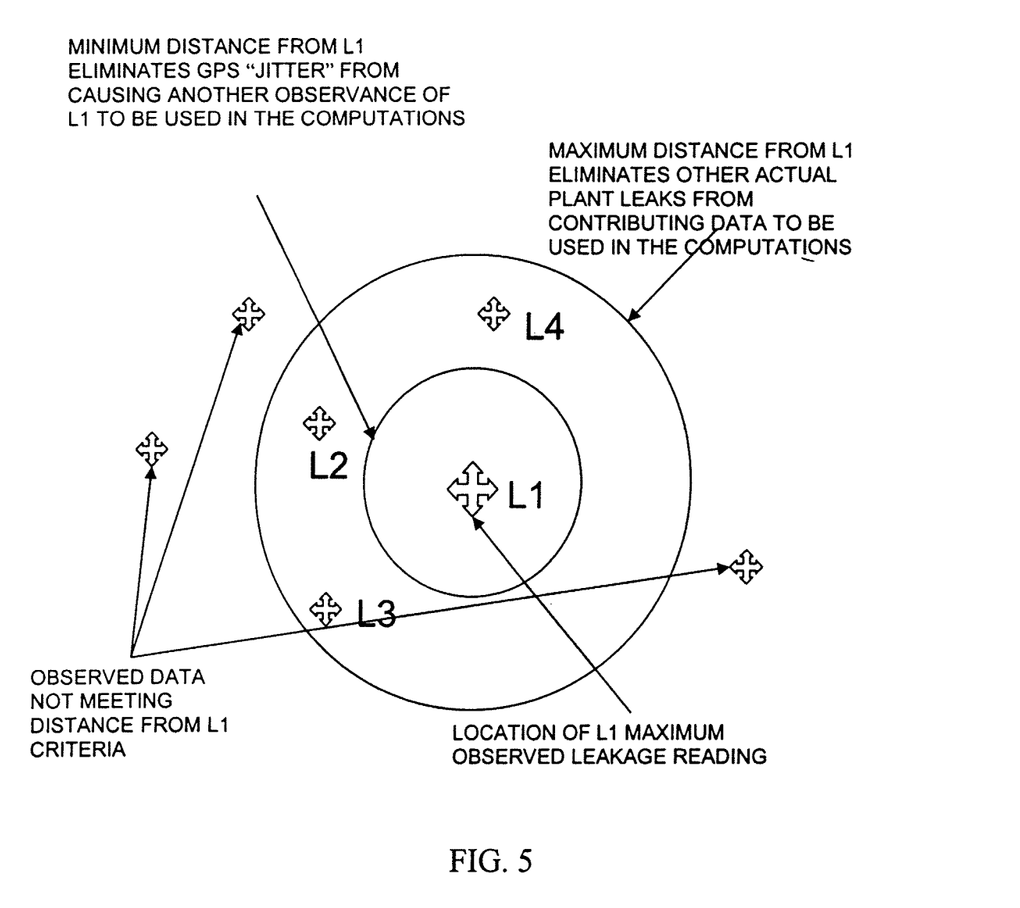
FIG. 5 illustrates a diagram useful in understanding the present invention.
Figure 6:
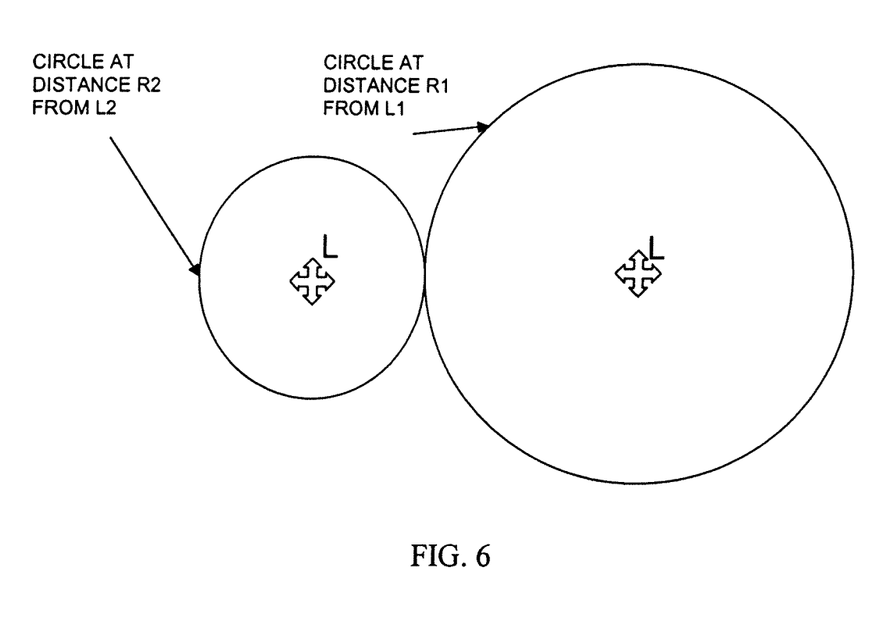
FIG. 6 illustrates a diagram useful in understanding the present invention.

FIG. 4 illustrates the projected leakage position graphically from the latitudes $y_1, \ldots y_4$ and longitudes $x_1, \ldots x_4$ of the four measured leakage signal strengths $z_1, \ldots, z_4$.

A more sophisticated method for finding the common intersection point is to project the potential circles of each leakage "cone" onto the common (x, y) plane and create a list of intersection points at which the leakage potential is identical by gradually increasing the radii of the circles and finding the intersection with the matching leakage potential which will effectively project the intersection arc of the cones onto the common (x, y) plane. Once the list of arc points from the first pair of points is obtained, then the same procedure is followed with the second pair of cones. Once both the lists of points are available, the closest two points from each of the sets to each other can readily be determined. Once the closest two points from each of the sets to each other are found, all that need be done is to evenly split the distance between these two single points and create a new composite point. This provides an even more accurate leak location than the line intersection method previously described.

To facilitate the intersection of the arc projections, a further enhancement is to compare the Cartesian angle between the first pair of points to the angle between the second pair of points and ensure that they are such that the lines drawn between the pairs would cross each other.

A further enhancement is to insure that the points being used in the computation are far enough apart that they would not have been generated by a stationary GPS-equipped receiver. In this regard, it is known that a stationary GPS will generate readings indicating different positions over time due to many factors beyond the control of the user and essentially cause GPS "jitter" in the reported position. It is contemplated that this enhancement will also be used in combination with some empirically gathered data which would suggest a maximum distance from the highest value observed that would still likely be the same leakage source. Otherwise, if data were used without regard to a maximum distance, multiple leakage locations could contribute extreme amounts of error to this method of location.

A C code implementation of the complete algorithm including the above enhancements follows.

Figure 7:
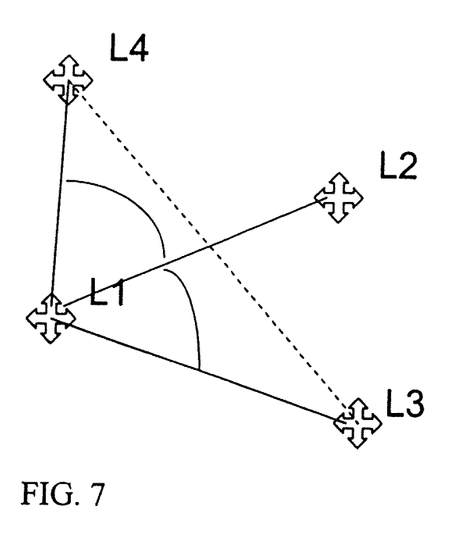
FIG. 7 illustrates a diagram useful in understanding the present invention.
Figure 8:
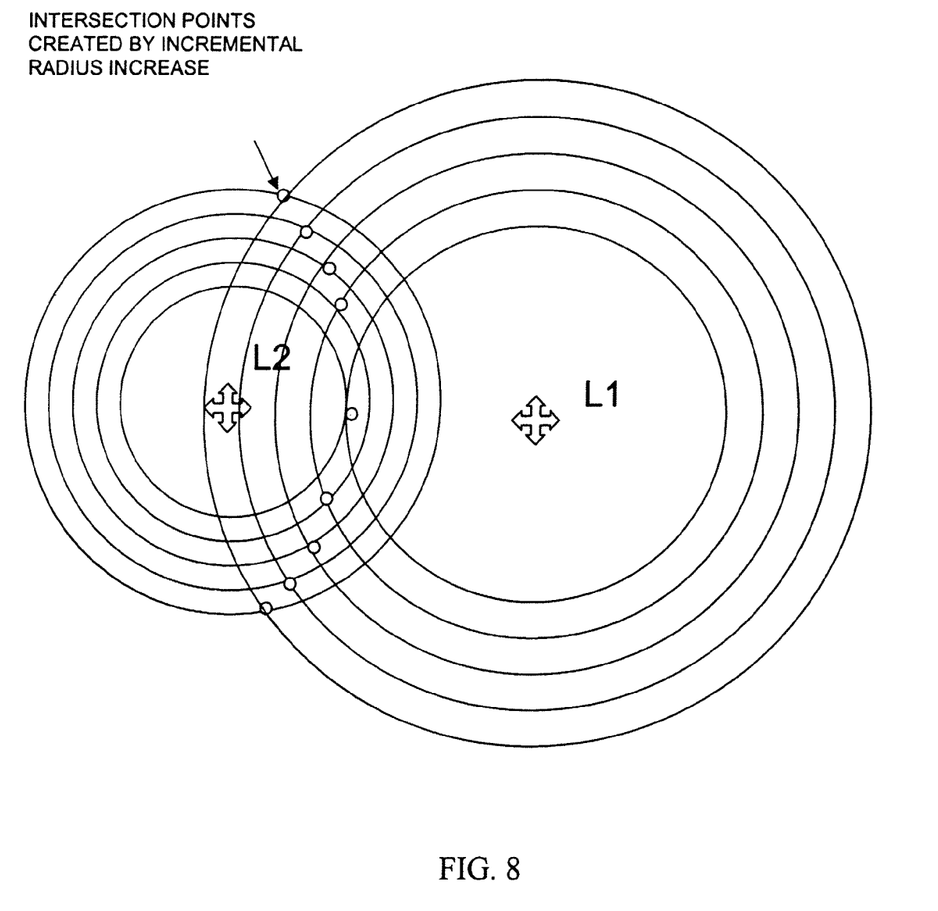
FIG. 8 illustrates a diagram useful in understanding the present invention; and, FIG. 9 illustrates a diagram useful in understanding the present invention.

With reference to FIG. 7, the angular difference between line L1-L2 and line L1-L3 must be of opposite sign from the angular difference between line L1-L2 and line L1-L4. This ensures that line L3-L4 will eventually cross line L1-L2. This increases the likelihood that the intersection set of the potential cones/rings between L1 and L2 will have a common location with the intersection set between L3 and L4.

One key assumption of this method is that it is reasonable within the relatively small distances involved here is that the surface of the earth is essentially flat and that a Cartesian coordinate system is a good approximation for both latitude and longitude in certain portions of the computation. A curved surface model could be created and would perhaps be even more effective, but would take significantly more processing resources than this implementation does. This method has been effectively implemented in a Cortex-M3 processor derivative in a portable instrument in the vehicle and functions in near real time.

Issues exist with respect to GPS and "driveout" (that is, dispatching of a repair technician or the like with directions to the location of a detected or calculated leak) direction and/or location accuracy. The issues include the established fact, illustrated in the following Table II, that a high percentage of leaks discovered in a driveout cannot be found at the address reported by the generally used GPS databases when a technician goes into the field to repair them. Possible reasons include leak address errors due to reverse geocoding limitations and misinterpretation of processed data. With respect to reverse geocoded addresses, one issue is the accuracy of reverse geocoded addresses. Another is whether different mapping services provide different address for the same GPS location. Three suppliers, Bing™, MapQuest®, and Google™ were compared. Parenthetically, MapQuest® is the supplier employed in the system described in this application. In the following descriptions, all addresses are derived from same set of GPS leak coordinates.

The following Table II illustrates the issue, and demonstrates that some addresses vary widely, sometimes even resulting in the different mapping services identifying the same GPS coordinates with different streets. In other instances, the different mapping services identify the same address or nearby (for example, adjacent) addresses for the same GPS coordinates.

TABLE II

GPS and Location Accuracy

| BING Address | MapQuest Address | Google Address |
| --- | --- | --- |
| 25 Pavilion Rd | 32 Village Drive | 16-18 Village Drive |
| 60 Alyce Ln | 85 Alyce Lane | 2 Hopkins Street |
| 52 Borton Ave | 38 Borton Avenue | 48 Borton Avenue |
| 24 Borton Ave | Old Mill Rd | 67-89 Centennial Blvd |
| 11 Regan Ct | 81 Reagan Court | 10-12 Reagan Court |
| 39 Covington Ln | 37 Covington Lane | 39 Covington Lane |
| 2001 Morris Dr | 2001 Morris Drive | 2000-2002 Morris Drive |
| 122 North Ave | 153 Bethel Avenue | 155 Bethel Avenue |
| 21 S Rose Ln | 14 Holly Drive | 6 Holly Drive |
| 7 Hamilton Ave | 5 Hamilton Avenue | 7 Hamilton Avenue |
| 20 Marshall Ave | 87 Marshall Avenue | 11-99 Marshall Avenue |
| near 193 Tansboro Rd | 196 Tansboro Road | 200-298 Tansboro Road |
| near 412 Berlin Cross Keys Rd | 411 Berlin Cross Keys Road | 410-424 Berlin Cross Keys Road |
| near 912 Hainesport | 966 Hainesport | 914 Hainesport |
| Mt Laurel Rd | Mt. Laurel | Mt Laurel |
| 2 Whittier Dr | 8 Easton Way | 9 Easton Way |
| near 49 Brook Ln | 50 Brook Lane | 28 Willow Brook Way |
| 20 Lenox Dr | No # Heather Lane | No Address Match |
| 3 Sailor Ct | 31 Sailor Court | 3 Sailor Court |
| 3 Chase Rd | 3 Chase Road | No # Chase Road |
| 572 Main St | 574 Main Street | 572 Main Street |
| near Municipal Dr | 2 Municipal Drive | 1 Municipal Drive |
| near 29 Calvert Ln | 75 Calvert Lane | 29 Clover Street |

Additional limits on accuracy confirmed in discussions with the mapping services' technical service departments include universal acknowledgment that addresses are only approximate, that the estimated addresses can differ between map service providers for same GPS coordinates, and that address interpolation can be as great as 10:1, contributing significantly to errors in identifying leakage locations and addresses. When added up, these potential sources of error in address specification yield disagreement on the correct address. As an example of one effect of address interpolation in a real world situation which is illustrated herein, the distance between 2 Whittier Drive, Hainesport, New Jersey and 8 Easton Way, Hainesport, N.J. is about 289 feet (about 88.1 meters). An actual leak location was at 7 Easton Way, across the street from 8 Easton Way, but down the street and around the corner, 289 feet from 2 Whittier Drive, the address identified by one of the mapping services.

In a GPS accuracy assessment, a field experiment was conducted to determine how much GPS location error might be encountered by a repair technician dispatched to investigate and/or repair a leak reported by the method previously described. The experiment started at the coordinates predicted by the system according to the present invention. Then, using the Seeker™ instrument available from Trilithic, Inc., the instrument operator "walked down" (that is, walked along the cable until the leak was isolated and positively identified) the leak location, computed the distance offset, and recorded the nearest actual address. In doing so, Garmin® point-of-interest (hereinafter sometimes POI) files were used rather than estimated addresses. The results of this experiment are illustrated in Table III. Significantly, all leaks were successfully located. Equally importantly, all leaks were found within 25 feet (about 7.6 meters) of their locations predicted by the system according to the invention.

TABLE III

Comparison of Predicted and Actual Leak Locations

| Actual Address (from Garmin ® POI files) | Leak Location |
| --- | --- |
| 32 Village Drive | within 25 ft of dot |
| 58 Alyce Lane | within 25 ft of dot |
| 52 Borton Avenue | within 25 ft of dot |
| 1 Old Mill Drive | Dot is on leak |
| 13 Reagan Court | Dot is on leak |
| 37 Covington Lane | within 25 ft of dot |
| 1916 Morris Drive | within 25 ft of dot |
| 155 Bethel Avenue | Dot is on leak |
| 3 Holly Drive | Dot is on leak |
| 7 Hamilton Avenue | Dot is on leak |
| 20 Marshall Avenue | Dot is on leak |
| 212 Tansboro Road | Dot is on leak |
| 417 Berlin Cross Keys Road | Dot is on leak |
| 908 Hainesport Mt Laurel | Dot is on leak |
| 7 Easton Way | within 25 ft of dot |
| 26 Brook Lane | Dot is on leak |
| 2 Heather Lane | Dot is on leak |
| 2 Sailor Court | within 25 ft of dot |
| 2 Chase Road | within 25 ft of dot |
| 568 Main Street | Dot is on leak |
| close enough | Dot is on leak |
| 29 Calvert Lane | Dot is on leak |

Tables II and III are combined in Table IV to illustrate the leak address error problem in a graphical manner.

The system of the present invention thus provides a GPS "dots on a map" solution to this problem. The system of the present invention provides GPS locations, latitude and longitude coordinates, which are capable of being plotted as dots on a map. The Seeker™ GPS takes a leakage measurement once every second, and attaches latitude and longitude coordinates to the measurement. Over the course of an operator's shift, this results in the generation of many data points which are supplied to a leakage server. The server executes the method described above, resulting in intersections at, or very close to, the actual leakage locations in a cable system. These intersections are plotted on a map of the cable system, thereby providing what essentially amount to driving directions to leaks. Technicians use these driving directions when they are dispatched to repair the leaks. Significant features of the system are that no leakage thresholds are used or needed. The system calculates leakage signal strengths from the signal strengths measured at various latitudes and longitudes over the course of the technician's shift. Additionally, if multiple technicians' vehicles are in service, data from multiple technicians' vehicles may be included in the data used to generate Table I, and thus in the above-described calculations.

Alternatively, GPS can be used to generate dots (that is, locations) on a map, such as a so-called "strand" map of the cable system, and attach the dotted strand map to a repair work order or generate the dotted strand map as a component of the work order. In this scenario, no reliance is placed on reverse geocoding, which, as noted above, can be somewhat unreliable or misleading, although reverse geocoding may be added if it is convenient to do so.

If leakage repair procedures do not allow use of maps, a portable navigation device, such as a Garmin® GPS based navigator, TomTom® GPS based navigator or the like. One or more POI files can be downloaded to a technician's navigation device. Navigation can be "turn-by-turn" with no reference to maps.

The system of the present invention already includes POI file storage and retrieval capability. The system of the present invention thus provides "cradle-to-grave" treatment of leaks.

TABLE IV

| BING Address | MapQuest Address | Google Address | Actual Address |
| --- | --- | --- | --- |
| 25 Pavilion Rd | 32 Village Drive | 16-18 Village Drive | 32 Village Drive |
| 60 Alyce Ln | 85 Alyce Lane | 2 Hopkins Street | 58 Alyce Lane |
| 52 Borton Ave | 38 Borton Avenue | 48 Borton Avenue | 52 Borton Avenue |
| 24 Borton Ave | 39.84937-74.95699 | 67-89 Centennial Blvd | 1 Old Mill Drive |
| 11 Regan Ct | 81 Reagan Court | 10-12 Reagan Court | 13 Reagan Court |
| 39 Covington Ln | 37 Covington Lane | 39 Covington Lane | 37 Covington Lane |
| 2001 Morris Dr | 2001 Morris Drive | 2000-2002 Morris Drive | 1916 Morris Drive |
| 122 North Ave | 153 Bethel Avenue | 155 Bethel Avenue | 155 Bethel Avenue |
| 21 S Rose Ln | 14 Holly Drive | 6 Holly Drive | 3 Holly Drive |
| 7 Hamilton Ave | 5 Hamilton Avenue | 7 Hamilton Avenue | 7 Hamilton Avenue |
| 20 Marshall Ave | 87 Marshall Avenue | 11-99 Marshall Avenue | 20 Marshall Avenue |
| near 193 Tansboro Rd | 196 Tansboro Road | 200-298 Tansboro Road | 212 Tansboro Road |
| near 412 Berlin Cross Keys Rd | 411 Berlin Cross Keys Road | 410-424 Berlin Cross Keys Road | 417 Berlin Cross Keys Road |
| near 912 Hainesport Mt Laurel Rd | 966 Hainesport Mt. Laurel | 914 Hainesport Mt Laurel | 908 Hainesport Mt Laurel |
| 2 Whittier Dr | 8 Easton Way | 9 Easton Way | 7 Easton Way |
| near 49 Brook Ln | 50 Brook Lane | 28 Willow Brook Way | 26 Brook Lane |
| 20 Lenox Dr | No # Heather Lane | No Address Match | 2 Heather Lane |
| 3 Sailor Ct | 31 Sailor Court | 3 Sailor Court | 2 Sailor Court |
| 3 Chase Rd | 3 Chase Road | No # Chase Road | 2 Chase Road |
| 572 Main St | 574 Main Street | 572 Main Street | 568 Main Street |
| near Municipal Dr | 2 Municipal Drive | 1 Municipal Drive | close enough |
| near 29 Calvert Ln | 75 Calvert Lane | 29 Clover Street | 29 Calvert Lane |

Figure 9:
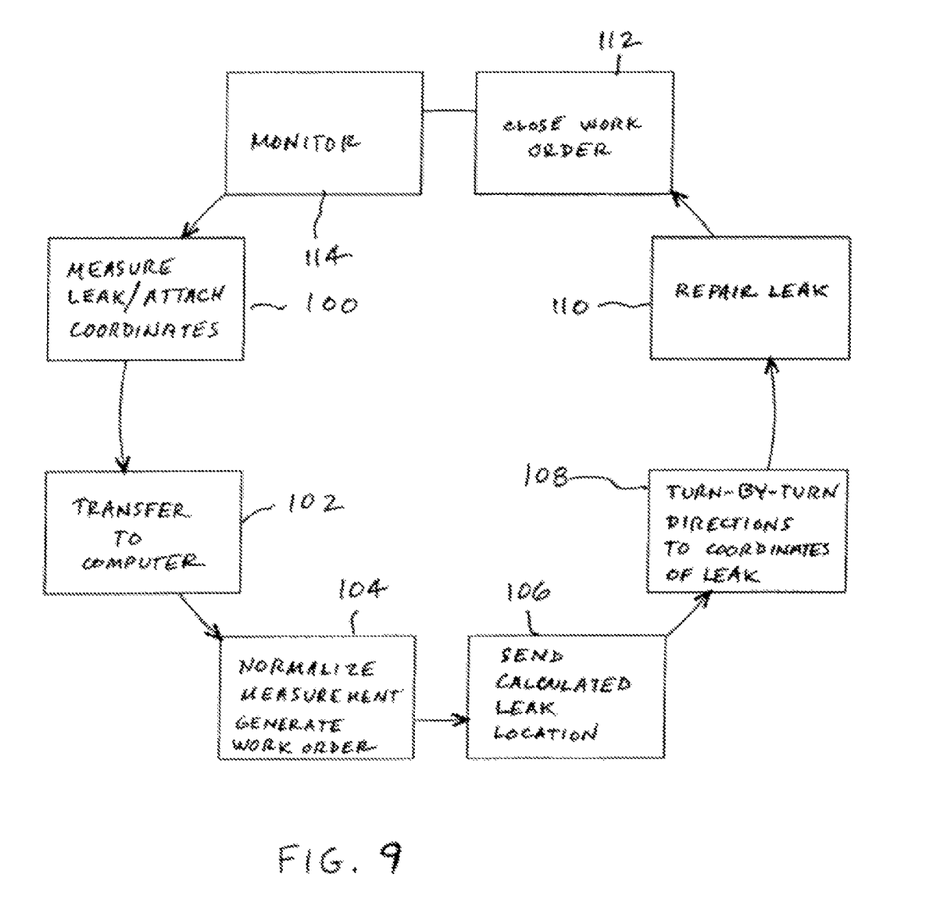

With reference to FIG. 9, technicians, installers, etc., log leakage signal strengths and GPS latitude and longitude coordinates, 100, as they go about their daily assignments. As previously noted, these measurements are made by each vehicle once a second or so. All of this data is uploaded, 102, to a leakage server, illustratively via wireless links, at appropriate times, for example, continuously via cell phone, or when the technicians return to the cable system headend or hub parking lots to park their vehicles for the evening or weekend. The server performs its calculations of signal strengths, 104, at calculated leak locations, and generates leakage maps with, for example, normalized signal strengths (typically normalized to three meters or ten feet from the calculated leak location), and latitude and longitude coordinates. When interrogated, or at regular or irregular intervals, the system sends, 106, the leakage signal strengths and/or calculated leak latitude and longitude coordinates directly or via the cable system headend or hub to the technicians' vehicles, for example, as components of, or attachments to, work orders. The latitudes and longitudes are converted, 108, by positioning and/or geolocation system, for example, GPS navigators, in the technicians' vehicles to turn-by-turn directions to the calculated leak locations. The technicians drive to the leaks, identify and repair them, 110, and close, 112, the work orders. All the while, the technicians' vehicles continue to monitor 114 the field around, taking leakage signal strength measurements and associating with the measurements latitudes and longitudes to be uploaded to the leakage server to generate future work orders.

What is claimed is:

1. A method for repairing signal leakage from a CATV network, the method comprising traversing an area served by the CATV network, measuring leakage signal strengths, identifying latitude and longitude coordinates where the leakage signal strengths are measured, storing the measured leakage signal strengths and latitude and longitude coordinates where the leakage signal strengths are measured, transferring the measured leakage signal strengths and corresponding latitude and longitude coordinates to a computer, calculating leak latitude and longitude coordinates and signal strengths on the computer from the transferred leakage signal strengths and latitude and longitude coordinates, transferring the calculated leak locations to technicians' vehicles, converting the calculated leak locations in the technicians' vehicles to turn-by-turn directions to the calculated leak locations, following the turn-by-turn directions to the leaks, and repairing the leaks
    wherein measuring leakage signal strengths, identifying latitude and longitude coordinates where the leakage signal strengths are measured, storing the measured leakage signal strengths and latitude and longitude coordinates where the leakage signal strengths are measured, and transferring the measured leakage signal strengths and corresponding latitude and longitude coordinates to a computer comprises making leakage measurements, making latitude and longitude measurements, associating each leakage measurement with a respective latitude and longitude measurement, creating a data base of associated leakage measurement and respective latitude and longitude measurement, selecting from the data base a number of leakage measurements, multiplying the selected leakage measurements times a first locus of points on which a leakage signal associated with that respective leakage measurement may be assumed to reside to develop a number of relationships among leakage measurement, latitude and longitude; solving a first pair of these relationships among leakage measurement, latitude and longitude for a second locus of points common to the first pair; solving a second pair of these relationships among leakage measurement, latitude and longitude for a third locus of points common to the second pair, projecting the second and third loci onto a common surface, and determining the intersection of the second and third loci on the common surface.

2. The method according to claim 1 wherein identifying latitude and longitude coordinates where the leakage signal strengths are measured comprises identifying GPS latitude and longitude coordinates.

3. The method of claim 1 further including determining the strength of the leakage signal by substituting the intersection of the second and third loci on the common surface back into a selected relationship among relationships among leakage measurement, latitude and longitude and solving for leakage signal strength.

4. The method of claim 1 wherein solving a first pair of these relationships among leakage measurement, latitude and longitude for a second locus of points common to the first pair, solving a second pair of these relationships among leakage measurement, latitude and longitude for a third locus of points common to the second pair together comprise selecting a latitude and longitude about which the solutions are to be normalized and solving the first and second pairs of relationships about the latitude and longitude about which the solutions are to be normalized.

5. The method of claim 1 wherein solving a first pair of these relationships among leakage signal strength, leakage and location for a second locus of common points to the first pair and solving a second pair of these relationships among leakage signal strength, leakage and location for a third locus of common points to the second pair, and projecting the second and third loci onto a common surface together comprise converting an angular distance into a linear distance.

6. The method of claim 5 wherein converting an angular distance into a linear distance comprises using a table to convert an angular distance into a linear distance.

7. The method of claim 5 wherein converting an angular distance into a linear distance comprises calculating a linear distance from an angular distance.

8. The method of claim 1 wherein measuring leakage and identifying latitude and longitude coordinates where the leakage is measured comprises intermittently measuring leakage and identifying latitude and longitude coordinates where the leakage is measured.

9. The method of claim 1 wherein measuring leakage and identifying latitude and longitude coordinates where leakage is measured comprises periodically measuring leakage and identifying latitude and longitude coordinates where the leakage is measured.

\* \* \* \* \*